United States Patent [19]
Underwood et al.

[11] Patent Number: 4,937,535
[45] Date of Patent: Jun. 26, 1990

[54] CALIBRATION METHOD AND PROGRAMMABLE PHASE-GAIN AMPLIFIER

[75] Inventors: Marcos A. Underwood, Monta Vista; Patrick L. McHargue, San Jose, both of Calif.

[73] Assignee: Genrad, Inc., Concord, Mass.

[21] Appl. No.: 291,570

[22] Filed: Dec. 29, 1988

[51] Int. Cl.⁵ .............................. H03F 3/30
[52] U.S. Cl. ................................ 330/284; 330/2
[58] Field of Search ............... 73/579; 307/262, 511; 330/2, 129, 278, 280, 281, 284, 302, 307

[56] References Cited

U.S. PATENT DOCUMENTS

| 4,115,741 | 9/1978 | Skutta | 330/284 |
|---|---|---|---|
| 4,225,976 | 9/1980 | Osborne et al. | 330/2 X |
| 4,260,953 | 4/1981 | Touzard et al. | 330/284 X |
| 4,683,542 | 7/1987 | Taniguti | 73/579 X |

Primary Examiner—Steven Mottola
Attorney, Agent, or Firm—Limbach, Limbach & Sutton

[57] ABSTRACT

A method for calibrating measurement or analysis systems that is externally traceable, simple, and repeatable, which is particularly amenable to computer control, and a unique programmable phase-gain amplifier which is especially suited for use in the calibration method, are disclosed. Alternatively, a programmable sample clock delay technique is disclosed to provide phase calibration. The method employs an externally traceable digital voltmeter to measure the magnitude of the signal being applied to an input channel of the measurement system; and obtains a digital representation of the output of the channel. When the input magnitude does not match the output magnitude, the programmable phase-gain amplifier gain is adjusted. These adjustments are made for each range of each channel. Thereafter, the relative phase shifts between channels is determined and the gain of a variable gain amplifier in the programmable phase-gain amplifier for each channel is changed to adjust the phase shift through each channel to the desired amount.

24 Claims, 14 Drawing Sheets

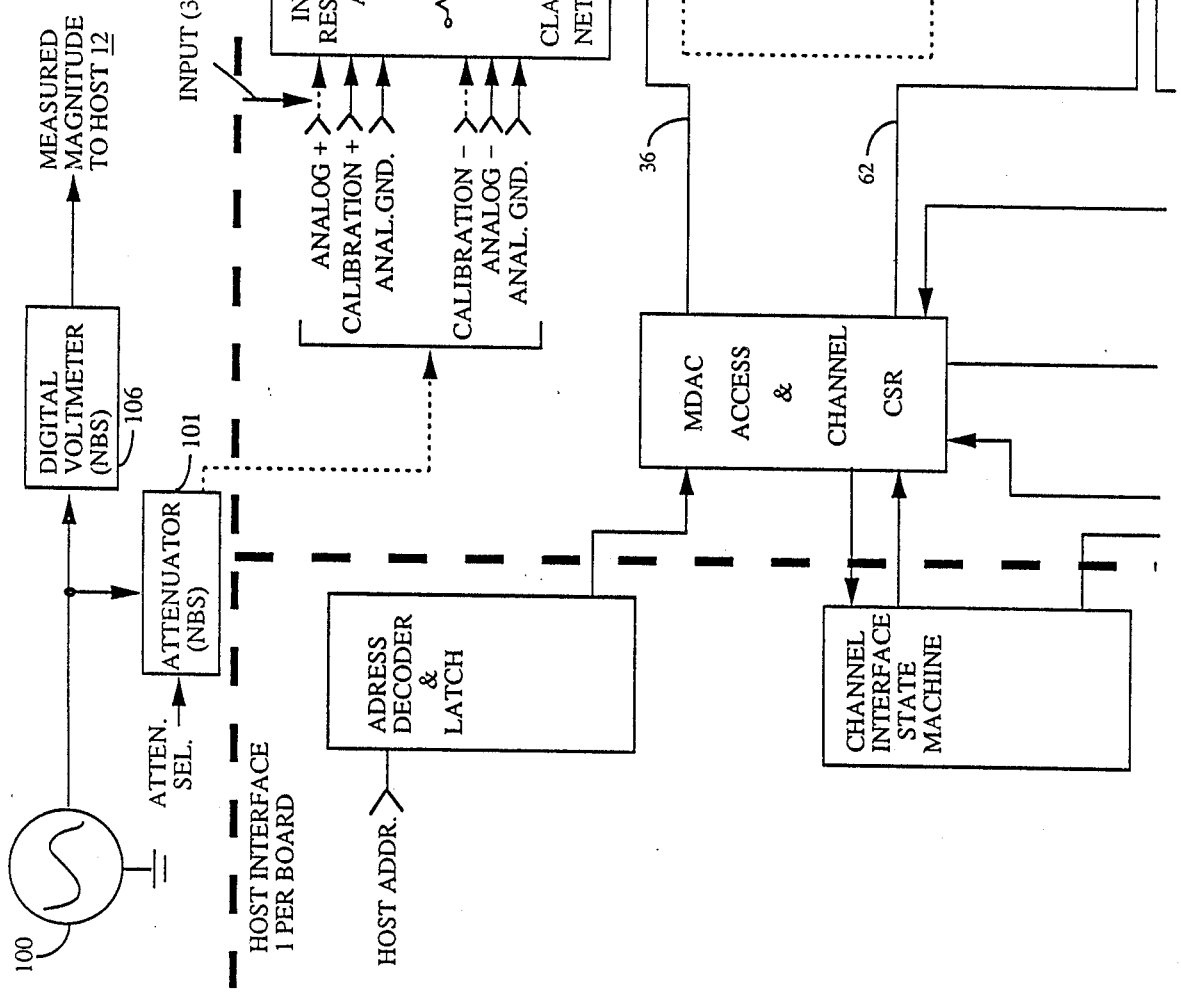

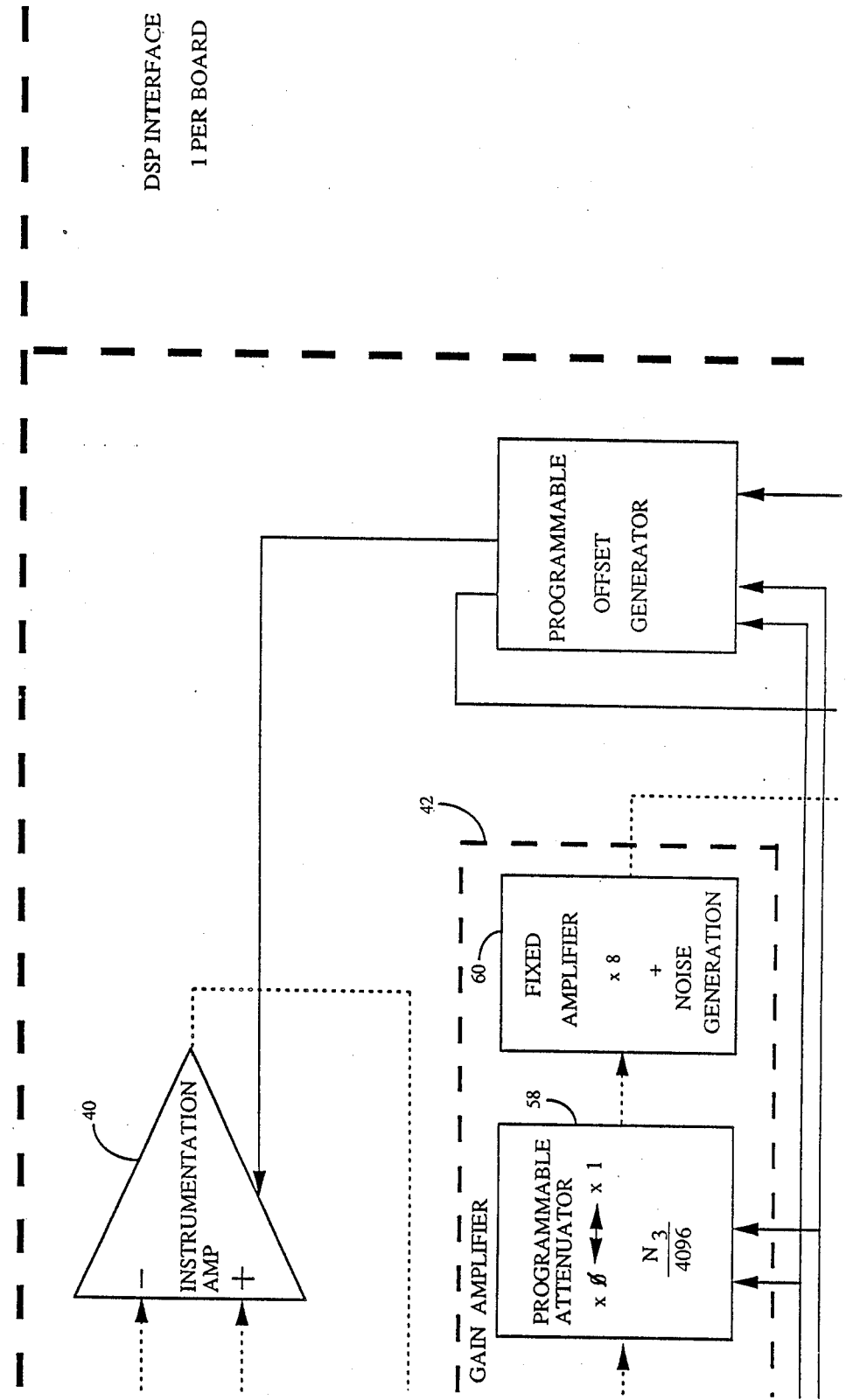
FIG.2A2

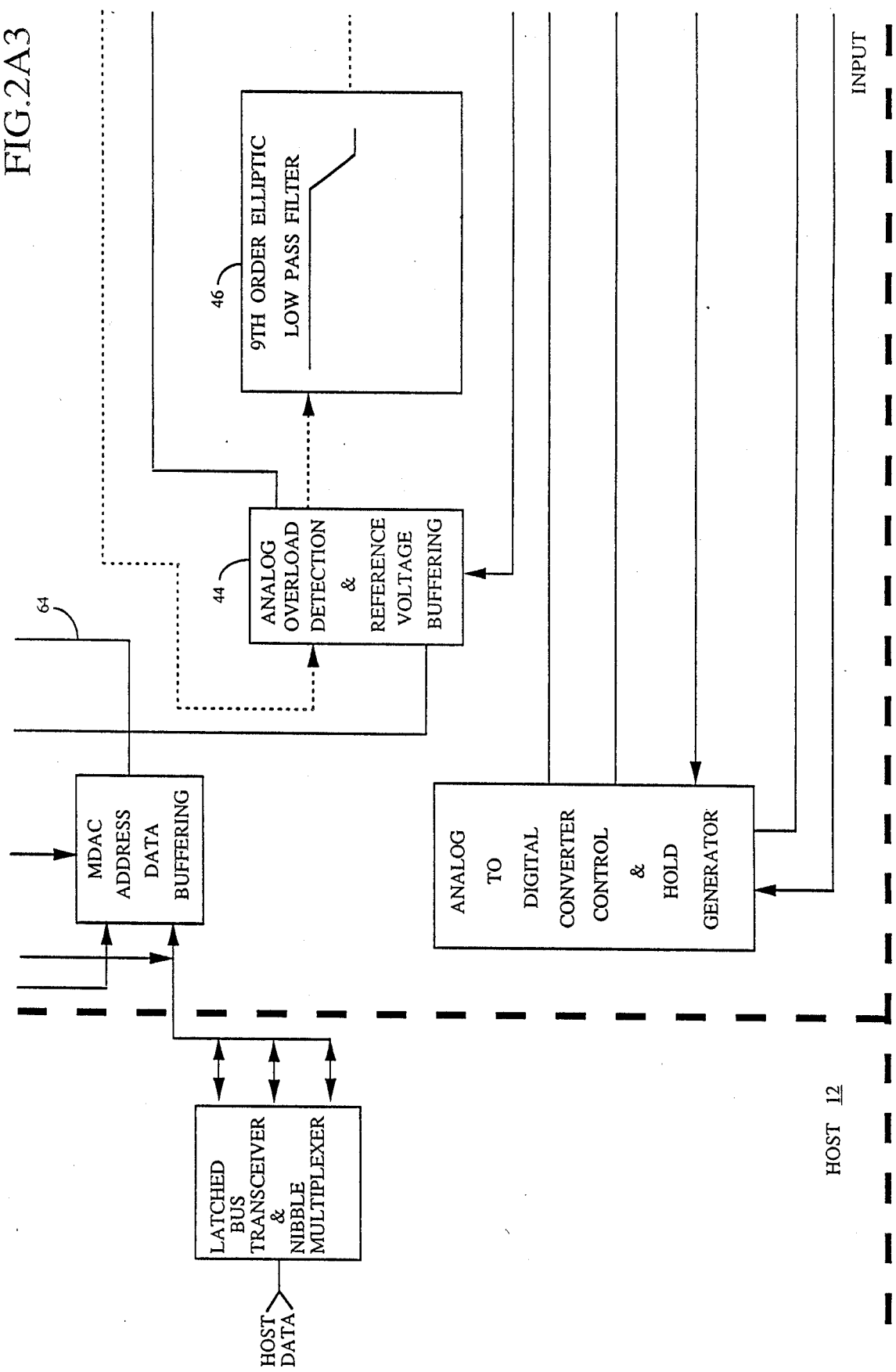

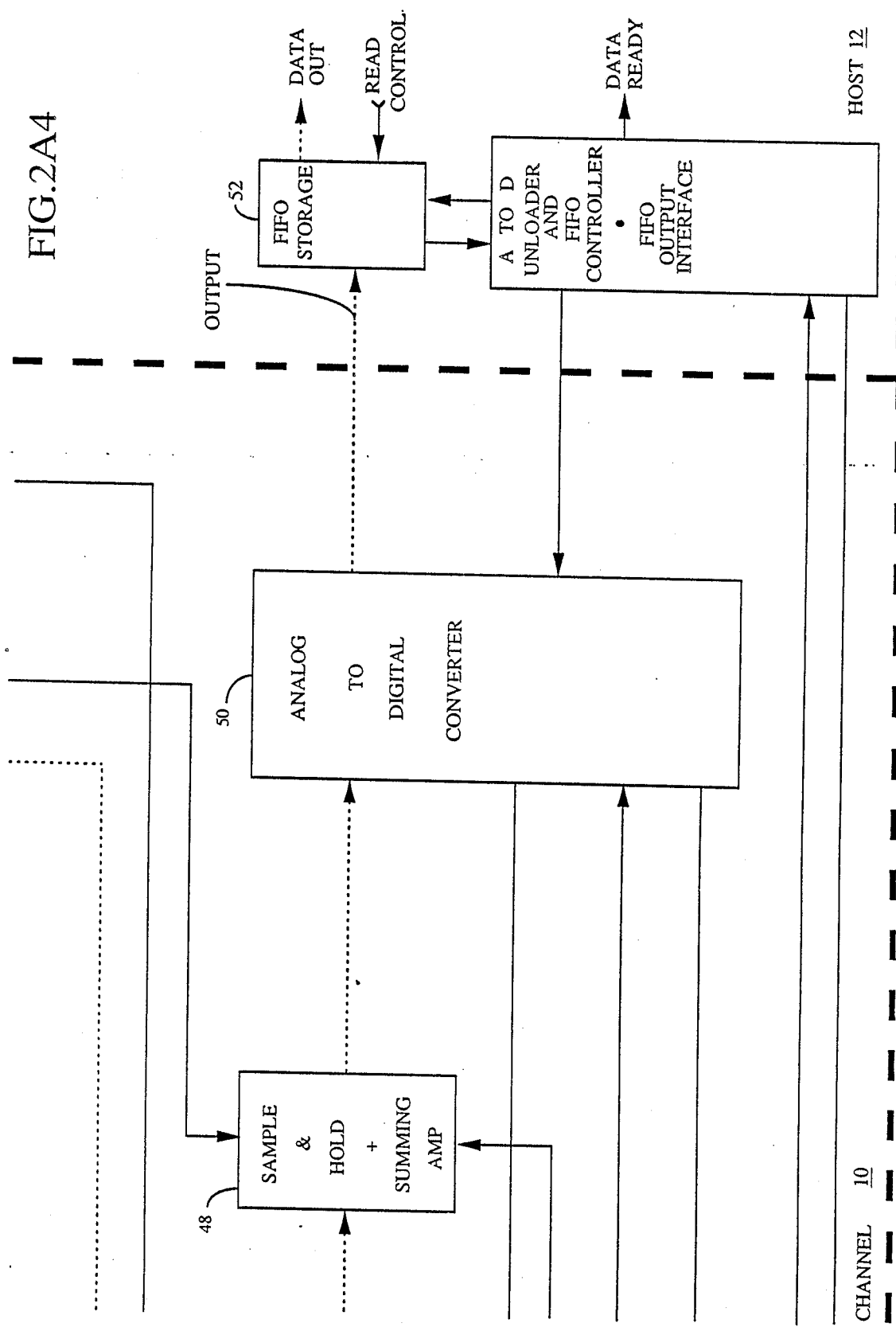
FIG.2A4

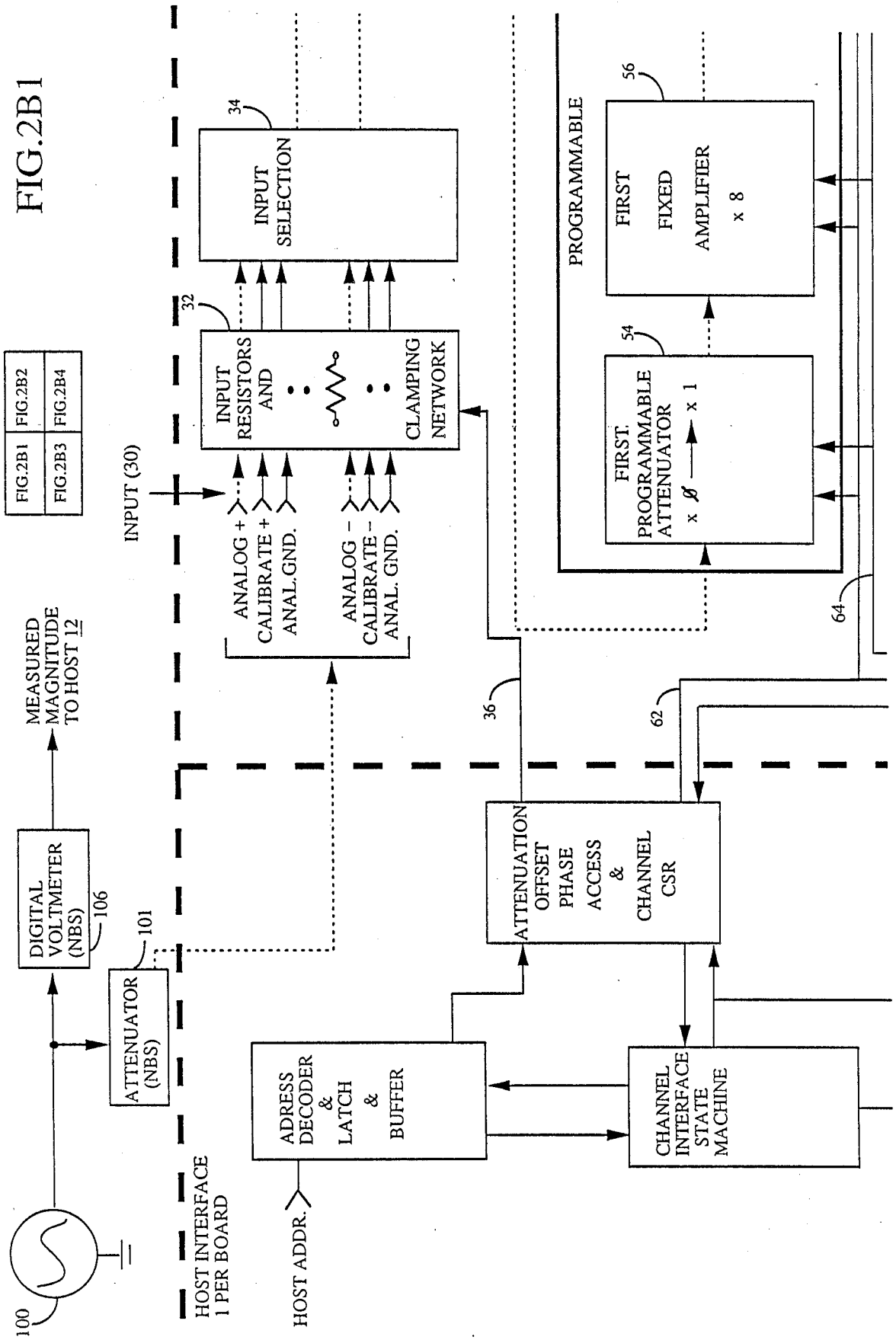

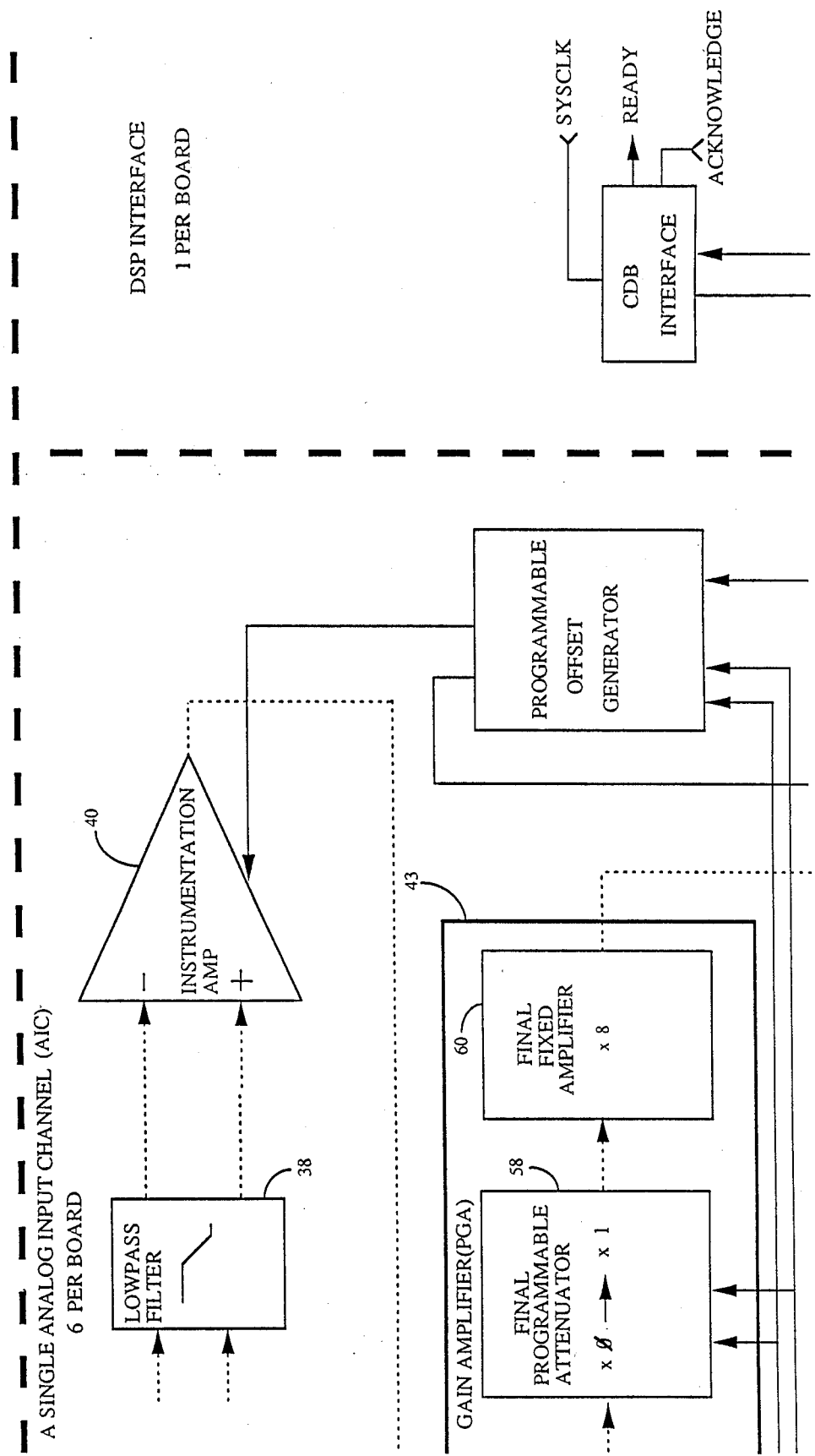
FIG.2B2

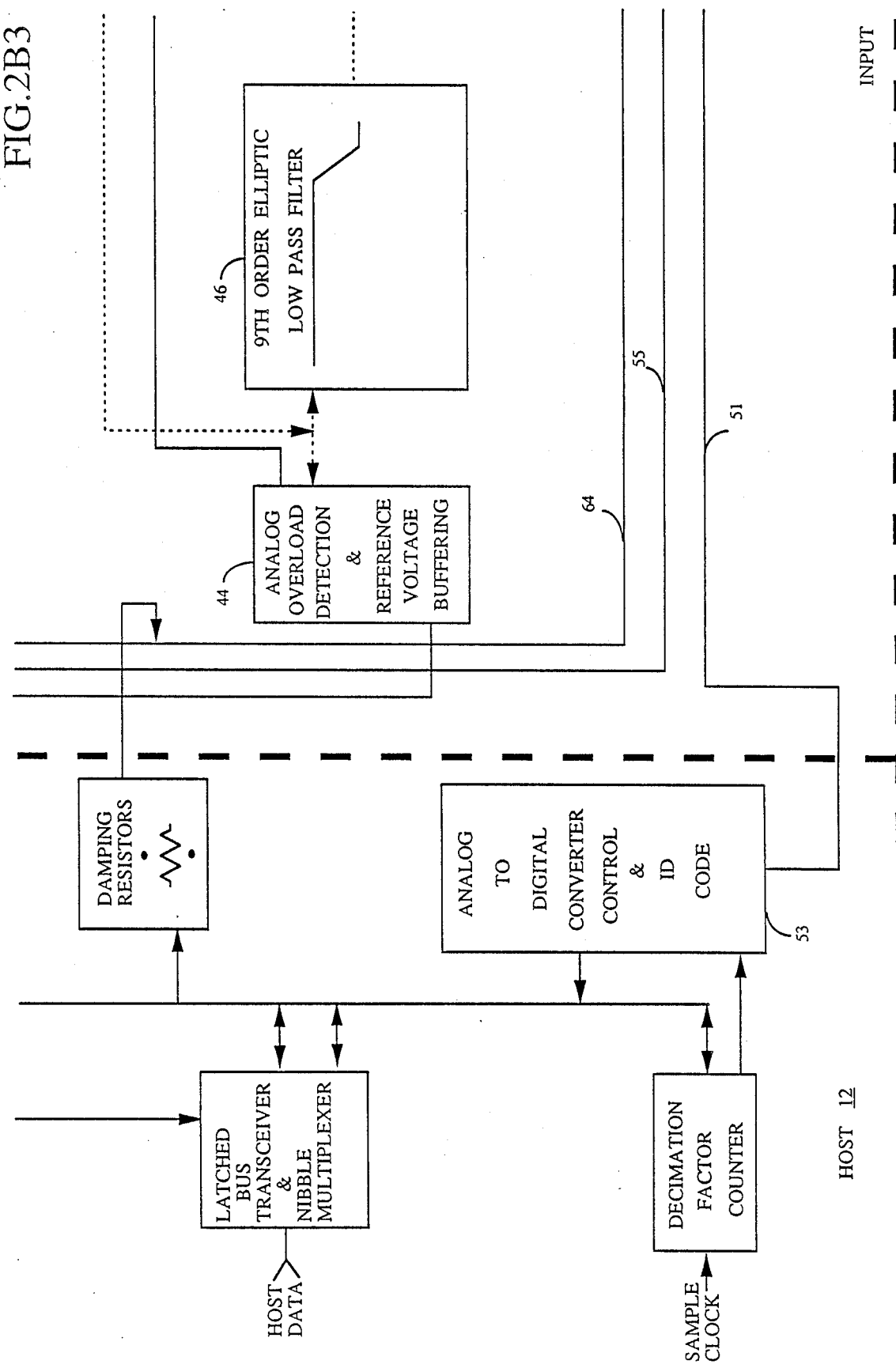

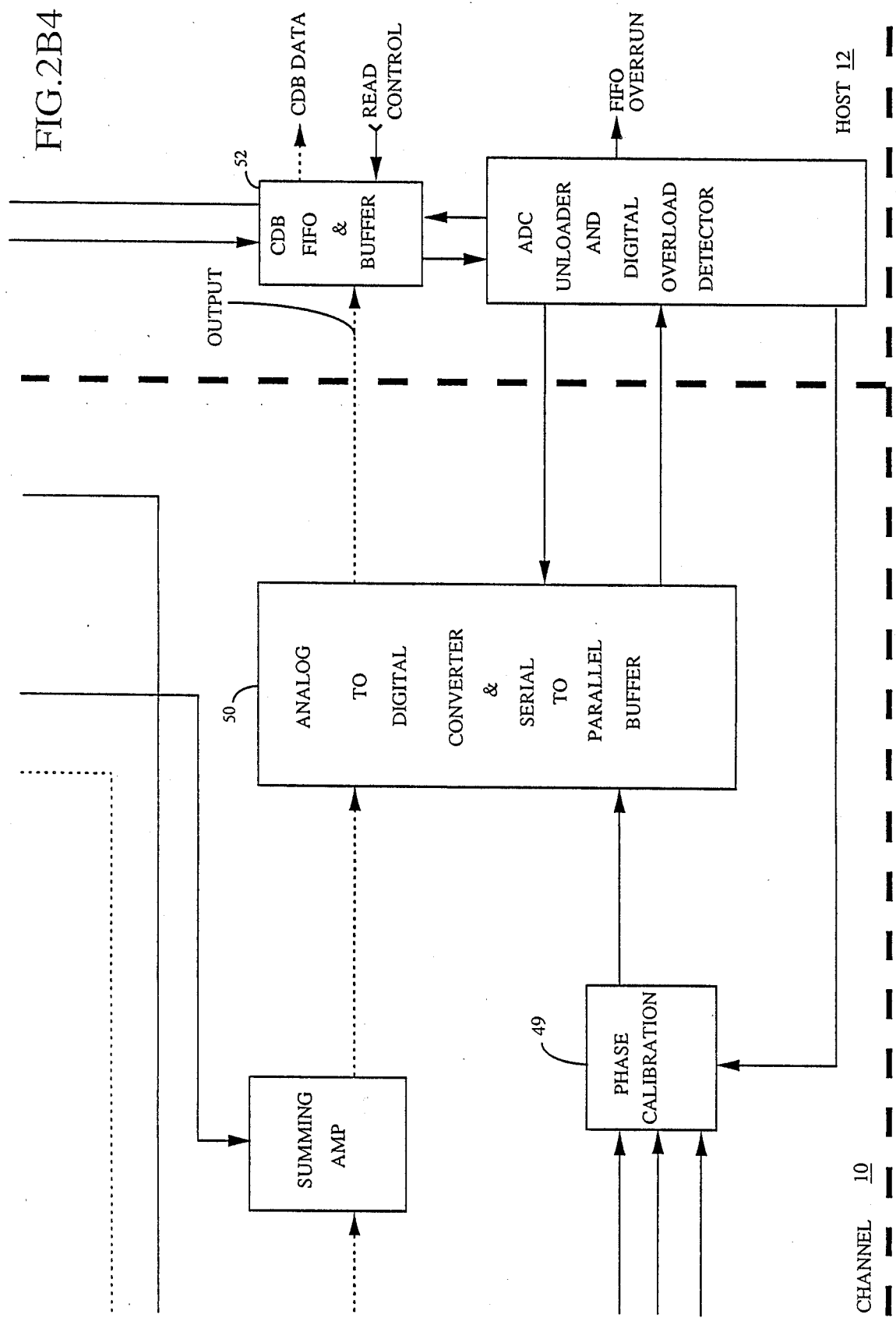
FIG. 2B4

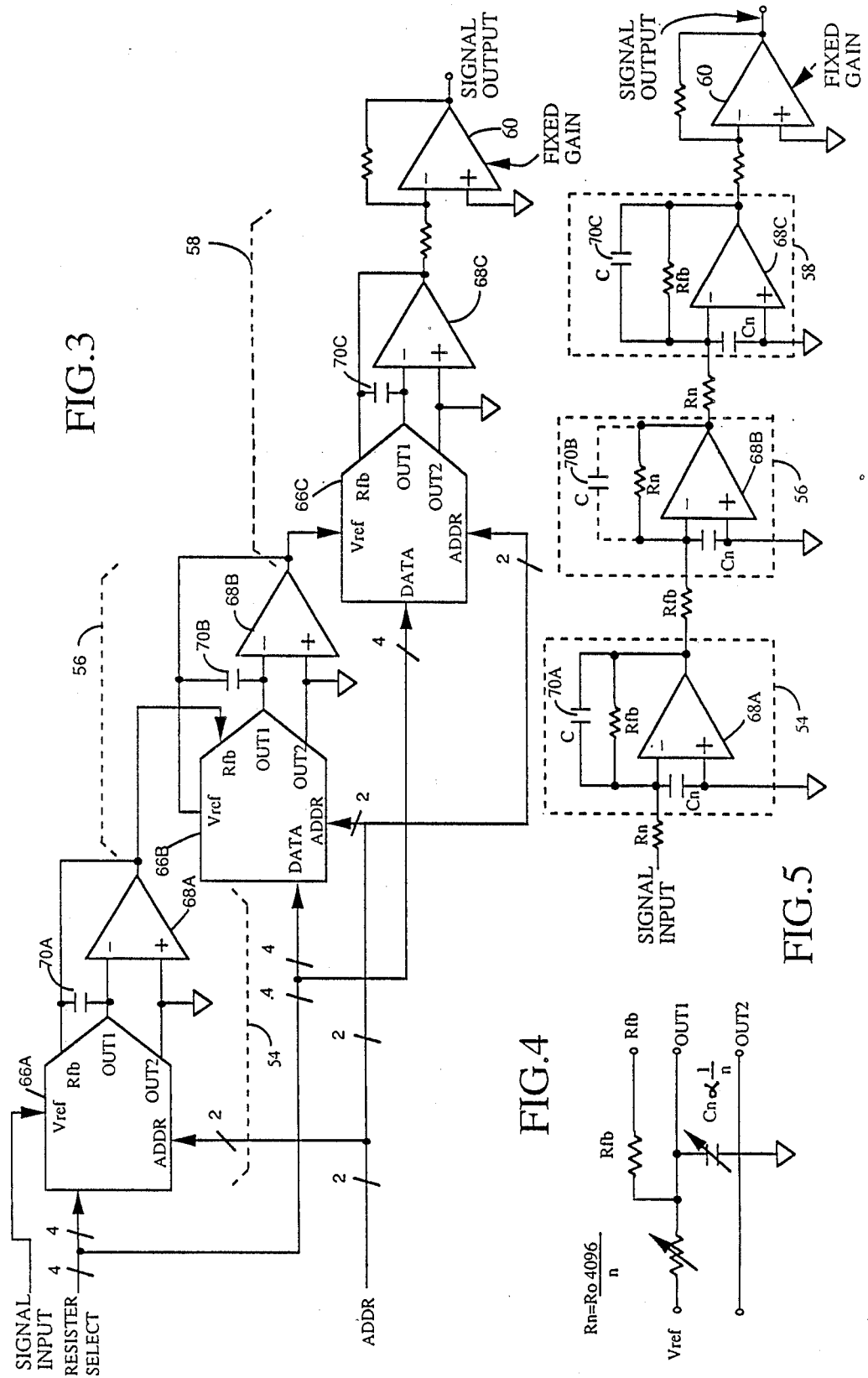

FIG. 6
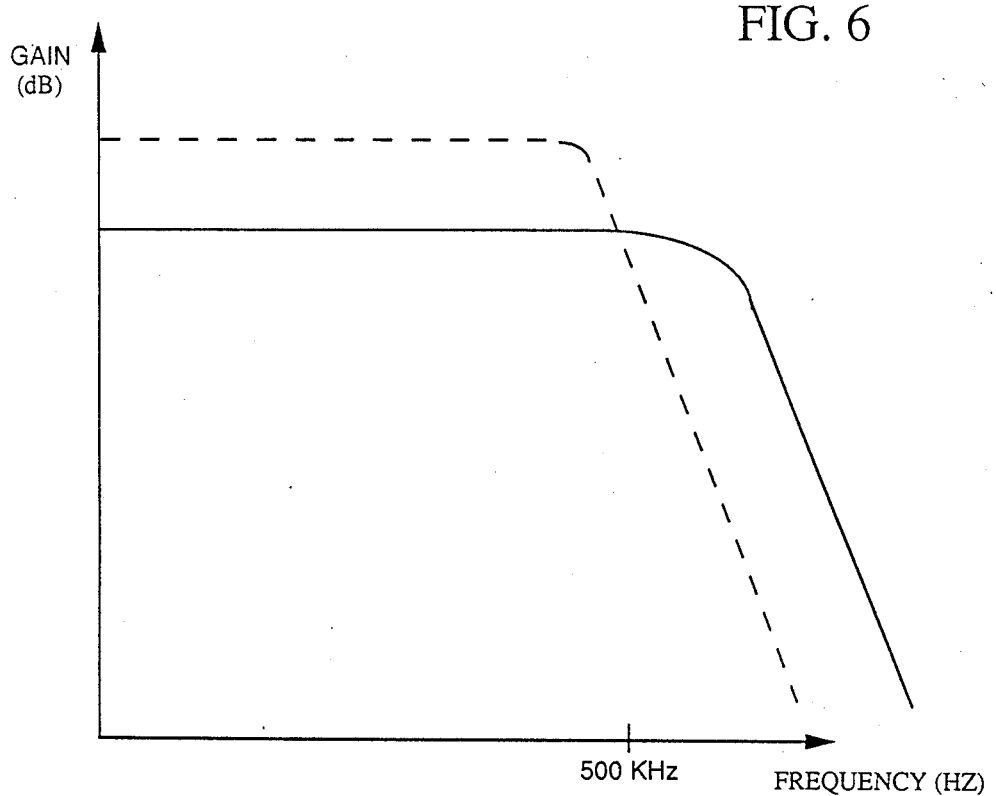
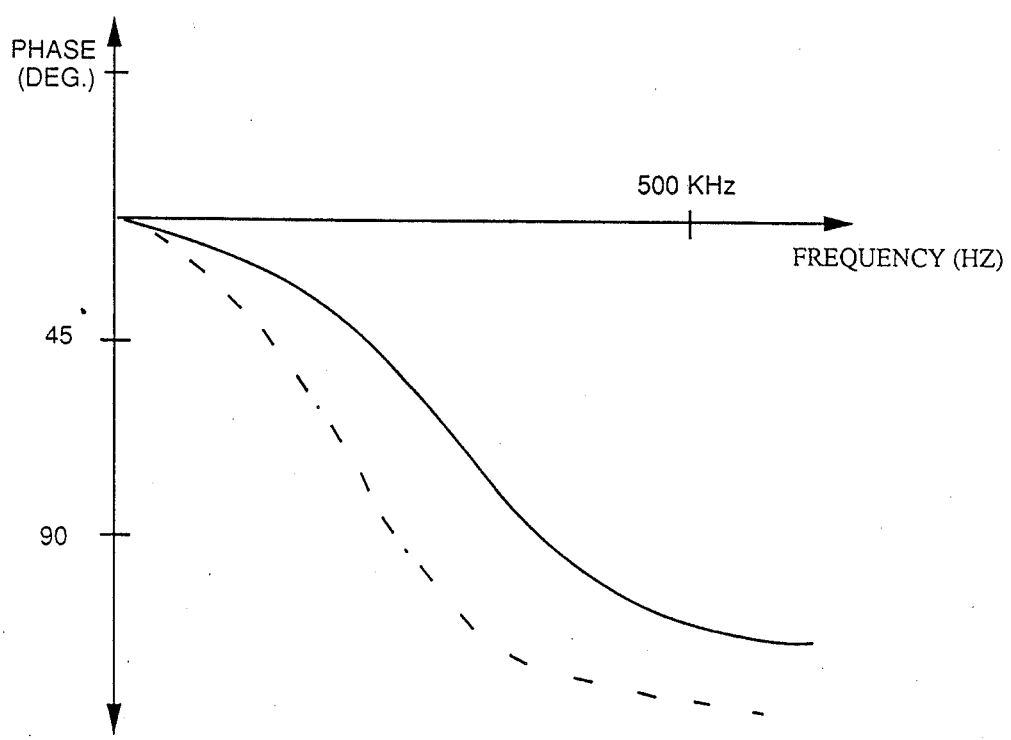

CALIBRATION METHOD AND PROGRAMMABLE PHASE-GAIN AMPLIFIER

TECHNICAL FIELD

The present invention is directed generally to the calibration of signal measurement channels, and more specifically to a method of calibration which is externally traceable, suitable for computer control, and which utilizes phase and gain adjustments in the signal path to achieve calibration.

BACKGROUND ART

In measurement or analysis systems, it is often important that the systems be calibrated so that they are externally traceable, preferably to some standard such as those maintained by the National Bureau of Standards. For example, in vibration analysis systems, a multiplicity of channels are utilized to receive data for analysis by the system, and to apply excitation signals to the device under test. For accurate analysis it is important that these channels be calibrated, and preferably in a manner which is traceable to the National Bureau of Standards.

In the past, calibration of such systems has been a laborious, manual, time consuming task because of the multiplicity of measurements at each range setting required to fully calibrate a system. Previously, the expected period over which a calibrated system would maintain its calibrated state, was quite short. This was due in part to the manual nature of the calibration process and the manner and mechanisms employed in calibrating them. For example, previous mechanisms suffered from susceptibility to mechanical vibrations, thermal cycling, oxidation, aging and the like. This resulted in instabilities which shortened the lifetime of the calibrated state.

More specifically, in the past calibration of input measurement channels was typically made by manually adjusting potentiometers, in order to adjust the gain of each channel, and adjusting components within a filter block in order to calibrate the phase shift through each channel. For example, potentiometers at the input to or at the output of a gain block, or the value of feedback resistors within a gain block, were adjusted in order to calibrate the gain of the stage. For phase adjustments, potentiometers or variable capacitors currently are used to adjust the poles and zeros within a high order anti-aliasing filter. Such adjustments cause undesirable changes in amplitude characteristics of the pass band.

Alternatively, rather than calibrate the channel itself, the representation of the signal after passing through the channel, was modified to reflect phase and gain corrections. More specifically, the representation of a signal that is received at the output of a channel is modified in amplitude and phase by correction factors previously determined by characterizing the particular channel for phase and gain deviations from a standard. An example of this approach can be found in U.S Pat. No. 4,162,531 to Rode et al.

As an example, for a particular channel, the gain and phase shift through the channel are measured and retained. If the measured gain differs from the desired gain, a correction factor is determined. This is repeated for the measured phase shift for the channel. When the channel is used to handle an actual signal, the signal is permitted to pass through the channel and, once through the channel, corrected by the phase and gain correction factors. Thus, if the signal at the output of the channel is represented as having an amplitude of X, and a phase shift of $\phi$, and if the gain correction factor is x and the phase correction factor is $\psi$, the representation of the signal might be modified to be $x * X$ and $\phi + \psi$. These correction factors must be determined and applied to each range/gain setting of the amplifier.

In the "X2" Series of Structural and Vibration Analysis Systems manufactured by Time Data Systems, Inc., predecessor to a now wholly owned subsidiary of the assignee of the subject application, utilized post sampling adjustments in software to adjust for differences in sampling times between channels. In such a system, samples from different channels were taken by time multiplexing each channel through a single sample and hold and analog to digital converter sampling path. As such, samples from different channels were shifted in time relative to one another by a fraction of the effective sample clock of the sampling path. This relative phase shift was accounted for in the post sampling software processing of the samples by assuming a fixed delay between the samples proportional to $1/f_s$, where $f_s$ is the effective sample clock.

In Pease, "DAC lends digital control to phase-shifter", EDN Design Ideas Special Issue, Vol. II, July 21, 1988, pp. 154 and 158, there is discussed digital control of phase in an all-pass phase shifter with unity gain. The circuit disclosed employs a digital to analog converter in a variable resistor mode and three operational amplifiers to provide a variable phase shift without a change in gain.

The following references are directed to gain and phase adjustments signal handling channels: U.S. Pat. Nos. 4,473,797, issued Sept. 25, 1984 to Shiota; Re. 31,750, issued Nov. 27, 1984 to Morrow; 3,654,804, issued Apr. 11, 1972 to Helmuth; and Russian 938053, Bul. 23/23.6.82. The following references are directed to the state of the art in vibration testing systems: U.S. Pat. Nos. 3,659,456, issued May 2, 1972 to Marshall et al.; 3,710,082, issued Jan. 9, 1973 to Sloane et al.; 3,800,588, issued Apr. 2, 1974 to Larson et al.; 3,842,661, issued Oct. 22, 1974 to Marshall et al.; 3,848,115, issued Nov. 12, 1974 to Sloane et al.; 4,297,888, issued Nov. 3, 1981 to Hirai et al.; 4,366,561, issued Dec. 28, 1982 to Klein; 4,493,213, issued Jan. 15, 1985 to Uretsky et al.; 4,513,620, issued Apr. 30, 1985 to Uretsky et al.; 4,513,622, issued Apr. 30, 1985 to Uretsky; and Japanese Patent No. 53-135358 dated Nov. 25, 1978.

It should be apparent that the previous calibration techniques which adjust components in the signal path are highly manual-labor intensive, and do not lend themselves easily to computer control, and that the techniques which modify the representation of the signal once it has passed through the channel can be complex and require that adjustments be made to each measurement taken or signal processed. What is needed is a system which is suitable for implementation under computer control and which is simple, inexpensive, reliable and externally traceable.

SUMMARY OF THE INVENTION

These and other problems and disadvantages of previous calibration methods and approaches are overcome by the present invention of a calibration method which utilizes a unique programmable phase-gain amplifier and a minimum of externally traceable calibration equipment.

The programmable phase-gain amplifier of the present invention employs an amplifier in which changes in gain also cause changes in phase, in conjunction with attenuator means in which changes in attenuation have only a minimal effect upon phase shift through the attenuator means. In this manner, the amplifier means can be programmed to have whatever gain will produce the desired amount of phase shift, and the attenuator means can be programmed so that the programmed attenuation when combined with the programmed gain of the programmable amplifier will provide the overall gain desired.

In the preferred embodiment of the present invention, the attenuator means and the programmable amplifier are constructed from the same basic inverting amplifier topology. However, components are added to each particular amplifier section to modify poles in the frequency response of the amplifier. The location of the poles in the attenuator stage are chosen to have little effect on phase despite changes in gain. Whereas, in the amplifier stage the poles are chosen so that changes in gain cause significant changes in phase.

The method of the present invention includes the steps of utilizing a signal magnitude measuring apparatus, such as a digital voltmeter ("DVM"), which is externally traceable, to measure the amplitude of a signal being applied to a particular channel; obtaining a digital representation of the signal magnitude at the output of the channel; and making gain adjustments through the channel until the digital representation of the output signal equals that measured by the externally traceable measurement apparatus. Preferably the gain adjustment is made by adjusting the attenuator means of the programmable phase-gain amplifier described above. The overall gain setting of the programmable phase-gain amplifier required to make the digital representation of the output of the channel equal to the input of the channel is then stored as the calibration adjustment for the channel for the channel range.

In a subsequent step of the method of the present invention, different ranges of the channel are calibrated. An attenuator which is externally traceable is used to attenuate the signal magnitude being applied to the signal channel by a specified amount. A digital representation of the magnitude of the output signal is again obtained and the attenuator means of the programmable phase-gain amplifier is adjusted until the output signal corresponds to the magnitude measured by the externally traceable measurement apparatus. The overall setting for the programmable phase-gain amplifier is then stored as the calibration adjustment for the channel for the particular signal magnitude range. This is repeated for different levels of attenuation by the externally traceable attenuator so that an overall gain setting is obtained for each of the measurement ranges for the channel. This is repeated for all channels.

Once all channels have been calibrated, gain-wise, phase calibration is performed by supplying the same input signal in common to all input channels and performing a spectral measurement on the output of each channel. More specifically, a cross-power spectrum is obtained of the outputs of the channels to determine the relative phase shift between each channel. Thereafter, using one channel as a reference, the other channels are adjusted in phase so that the relative phase shifts among all channels is zero.

Phase adjustment is performed by adjusting the programmable amplifier in the phase-gain amplifier. Alternatively, a programmable sample clock delay technique is used to adjust the relative phase between channels. Once the desired phase adjustment is obtained, the attenuators in the phase-gain amplifier are adjusted to obtain the desired overall gain setting through the channel.

It is therefore an object of the present invention to obtain a calibration method which is externally traceable and which is especially suitable for implementation under computer control.

It is another object of the present invention to provide a programmable phase-gain amplifier which is suitable for use in a computer controlled calibration method.

It is a further object of the present invention to provide a programmable phase-gain amplifier which utilizes an attenuator section and an adjustable gain section wherein gain adjustments in the adjustable gain section cause phase shifts to occur through the section, and further wherein adjustments in attenuation by the attenuator sections result in only a minimal change in phase through the sections.

It is still another object of the present invention to provide a calibration method which employs a minimum amount of measurement equipment which is externally traceable and which minimizes the time required to calibrate a system and the amount of manual labor required.

It is a still further object of the present invention to provide a calibration method which increases the longevity of the calibration provided.

These and other objectives, features and advantages of the present invention will be more readily understood upon consideration of the following detailed description and accompanying drawings.

BRIEF DESCRIPTION OF THE DRAWINGS

FIG. 2A is a simplified block diagram of the front end of the vibration analysis system of FIG. 1A illustrating the use of a programmable phase-gain amplifier in the signal path to calibrate the path.

FIG. 2B is a simplified block diagram of the front end of the vibration analysis system of FIG. 1A illustrating the use of a programmable gain amplifier and a sample clock delaying circuit in the signal path to calibrate the path.

FIG. 3 is a simplified block diagram of the programmable phase-gain amplifier of the present invention.

FIG. 4 is a simplified representation of the programmable resistor block of FIG. 3.

FIG. 5 is a more detailed block diagram of the programmable phase-gain amplifier of the present invention.

FIG. 6 illustrates the phase-gain relationship of the amplifiers used in the programmable phase-gain amplifier of the, present invention.

DETAILED DESCRIPTION OF THE INVENTION

Figure 1A:
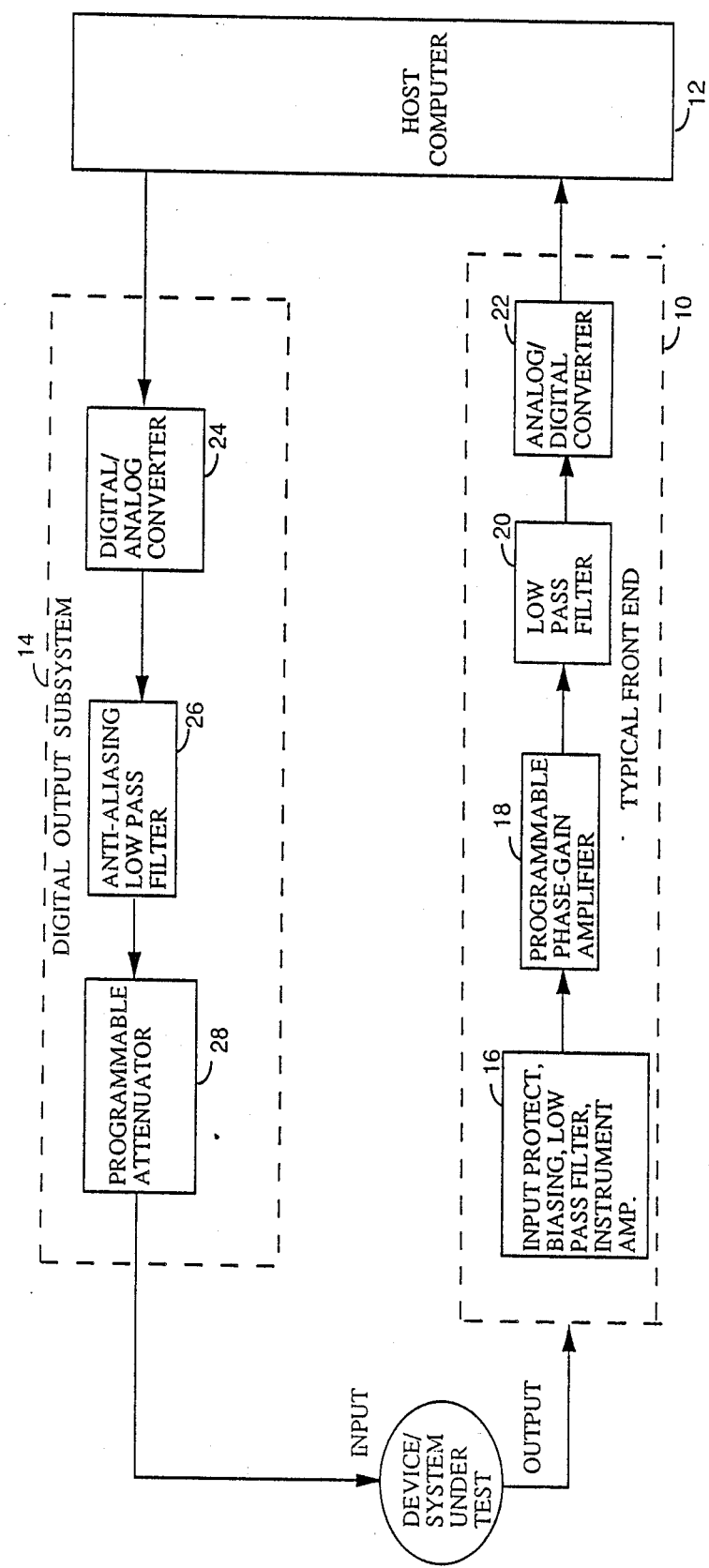
FIG. 1A is a simplified block diagram of a vibration analysis system for which the calibration method of the present, invention is especially suited.

Referring now to FIG. 1A, a simplified block diagram is shown of a vibration analysis system for which the calibration method of the present invention is especially suited. The system includes a front end section 10 which receives signals from the system under test, processes the signals, and supplies a digital representation of the signals to a host computer 12. The host computer 12 performs various analyses on the data. The host computer 12 also controls the digital output subsystem 14 of the system and causes the digital output subsystem to generate excitation signals that are applied to the system under test.

Generally, the front end 10 includes an input instrumentation amplifier 16, a programmable gain amplifier 18, a low pass filter 20, and an analog to digital converter 22. The digital output subsystem 14 includes a digital to analog converter 24, and anti-aliasing low pass filter 26, and a programmable attenuator 28.

Referring now to FIG. 2A, a more detailed description of the front end 10 of the vibration analysis system will now be provided. Signals to be analyzed are received at inputs 30. Block 32 represents input resistors and a clamping network to protect the front end circuitry from excessive signal levels. Block 34 receives the signals from block 32 and performs: a selection and biasing function. As can be seen from FIG. 2A, the selection and bias functions are controlled by the host computer 12 via signals on line 36. The outputs of block 34 are applied to a low pass filter 38, then to an instrumentation amplifier 40. The output of the instrumentation amplifier is applied to a programmable phase-gain amplifier 42. The output of the phase-gain amplifier 42 is applied to an overload detection and buffering block 44, and thence to a low pass filter 46. Low pass filter 46 can be a ninth order low pass filter. For purposes of this description of the present invention, the details of the filter and other components in the signal path are not critical. The output of low pass filter 46 is applied to a sample and hold block 48, and thence to an analog to digital converter 50. The output of the analog to digital converter 50 is stored in block 52 for access by the host computer 12.

It is to be appreciated that a multiplicity of the above input channels are employed in the typical vibration analysis system and that, because of the many signal handling blocks within the channel, phase and gain differences between channels are bound to occur.

PROGRAMMABLE PHASE-GAIN AMPLIFIER

As can be seen from FIG. 2A, programmable phase-gain amplifier 42 includes a programmable attenuator 54, a programmable amplifier 56, another programmable attenuator 58, and a fixed gain amplifier 60. As explained earlier, the programmable attenuators 54 and 58 provide adjustments in gain with a minimal amount of change in phase; e.g., less than 0.01 degrees per db of attenuation change. By use of devices which have lower values of parasitic capacitance, $C_n$, FIG. 5, even smaller variations in phase with respect to attenuation can be achieved. In contrast, the programmable amplifier 56 is configured so that a change in gain will cause a change in phase; e.g., typically 1.0 degrees per db of gain change. It is to be noted that the particular amount of attenuation in programmable attenuators 54 and 58, as well as the amount of phase shift and gain provided by programmable amplifier 56, are controlled by control signals and address and data on lines 62 and 64, respectively, from host computer 12.

In accordance with the present invention, no adjustments are made to the anti-aliasing filter 46 in order to achieve phase calibration. Preferably, the programmable phase-gain amplifier 42 includes at least two programmable attenuators and an intervening programmable amplifier to minimize the phase versus attenuation variations. By using additional attenuators, the phase versus attenuation variation can be further minimized, but with additional cost and complexity.

Referring more particularly to FIG. 3, the phase-gain amplifier 42 will be described in greater detail. In the preferred embodiment of the present invention, the attenuator section and the programmable amplifier section begin with the same basic components, that of a programmable resistor network and an amplifier section. It is the selection of the poles of the particular stage that determine whether or not there will be significant change in phase with changes in gain, or whether there will be only minimal changes in phase with changes in gain. In FIG. 3, blocks 66A, B and C represent programmable resistor arrays. These arrays can be multiplying digital to analog converter device number AD7542 manufactured by Analog Devices of Norwood, Mass. These devices can be viewed as programmable resistor blocks, a simplified representation of which is provided in FIG. 4.

As can be seen from FIG. 4, the resistor blocks include a variable resistor $R_n$ and a fixed feedback resistor $R_{FB}$. Resistor $R_n$ is connected at one end to the fixed resistor $R_{FB}$. The other ends of these resistors are available for connection to external circuitry. The junction of resistor $R_n$ and resistor $R_{FB}$ is brought out as pin out1. The variable resistor $R_n$ is programmable to have the values $(R_o * 4096)/n$, where $n = 0, \ldots, 4095$, and $R_o$ is some unit value of resistance. As such, the ratio $R_{FB}/R_n$ can be programmed to have the value $n/4096$, where $n = 0, \ldots, 4095$.

A pin out2 is also provided as can be seen from FIG. 4. There is a capacitance, $C_n$, having a value inversely proportional to n, between pins out1 and out2, where $C_n$ is directly proportional to the programmed value of resistor $R_n$.

Returning to FIG. 3, the other basic building block are amplifiers 68A, 68B, and 68C which can be device No. OP-11 manufactured by Precision Monolithics, Inc. of Santa Clara, Calif. These are conventional high-gain operational amplifiers. Programmable attenuator 54 is formed by utilizing the programmable resistor $R_n$ of block 66A in series with the input to amplifier 68A, and using the fixed resistor $R_{FB}$ in the feedback path between the output of amplifier 68A and the inverting input thereof. Programmable attenuator 58 is constructed in a similar manner. In the preferred embodiment of the present invention, the programmable attenuators 54 and 58 include a capacitor, 70A and 70C, respectively, connected in the feedback path of amplifier section 68A and 68C, and having a value of approximately 33 picofarads. The value of capacitors 70A and 70C play a substantial role in determining whether or not there will be significant changes in phase with changes in attenuation.

Programmable amplifier 56 employs an amplifier 68B which is connected to resistor block 66B so that the programmable resistor $R_n$ is placed in the feedback path of the amplifier, and so that the fixed resistor $R_{FB}$ is placed in series with the inverting input to the amplifier 68B. Further, capacitor 70B is connected in parallel with the programmable resistor $R_n$, and preferably has a value of approximately 10 picofarads.

FIG. 5 shows in more detail, the connections of the programmable resistor $R_n$ and the fixed feedback resistor $R_{FB}$ for the programmable attenuators 54 and 58, and the programmable amplifier 56.

A mathematical analysis of the programmable amplifier 56 is provided by way of equation 1.

$$\theta(\omega)_n = \tan^{-1}(\omega R_n C) - \tan^{-1}\left[\frac{\left[\frac{R_n C_n}{A} + \frac{K+1}{GBw} + \frac{R_n C}{A} + R_n C\right]\omega}{\frac{K+1}{A} + 1 - \omega^2 \left[\frac{R_n C_n}{GBw} + \frac{R_n C}{GBw}\right]}\right] \quad [1]$$

In the equation, $\theta$ represents phase, $\omega$ represents the angular frequency of the signal, GBw represent the gain band width of the amplifier section 68B, A represents the open loop gain of amplifier 68B, and K represents the DC gain through the stage, namely $R_n/R_{FB}$. Finally, $R_n$ corresponds to the programmable resistor, C corresponds to capacitor 70B, and capacitor $C_n$ corresponds to the inherent capacitance of block 66B.

This equation describes the phase shift through the programmable amplifier stage. The equation identifies two terms as predicting the phase shift, the first term is of greatest interest in that it has been determined that this term varies significantly when the value of programmable resistor $R_n$ is changed, and the magnitude of the second term is small compared to that of the first.

In the preferred embodiment of the present invention, the 10 picofarad value for capacitor 70B is selected for signals having a 20 kHz range. When signals having higher frequencies, such as radio frequencies, are to be processed, capacitor 70B can be dispensed with. This is the reason that capacitor 70B is shown connected via dotted lines in parallel with programmable resistor $R_n$.

Equation 1 can be used to describe the phase shift through the attenuator stages 54 and 58, by substituting $R_n$ for $R_{FB}$, and vice versa. As such, this causes the first term of the equation to equal $\tan^{-1}(\omega R_{FB} C)$; i.e. to be constant as the attenuation in the stage changes. The second term of the continues to have little impact over the phase shift through the stage as the attenuation through the stage is changed.

Referring to FIG. 6, it is to be understood that the programmable phase-gain amplifier of the present invention employs a programmable gain amplifier in which the knee of the frequency response of the amplifier is purposefully varied to change the phase shift through the amplifier; and programmable attenuating amplifier in which the knee of the frequency response is shifted well upwards in frequency so that there is little change in phase shift through the section even though there are large changes in the attenuation through the section.

FIG. 6 provides an example of gain and phase curves for the programmable gain amplifier of the present invention when signals in the 20 kHz range are to be measured. The knee of the gain, or frequency response, curve is set to occur at around 500 kHz. Note that at 500 kHz the phase curve is beginning to show substantial changes. Note also, however, that at 20 kHz, there is a finite amount of phase shift. As the value of the feedback resistor $R_n$ is changed, the knee of the curves changes, thus causing the phase to change. FIG. 6 shows in dashed curves what the gain and phase curves might look like if $R_n$ (the gain of the amplifier) was changed by a factor of two.

The gain through each of the programmable attenuator sections 54 and 58 can be expressed as n/4096, where $n = 0, \ldots, 4095$. The gain through the programmable amplifier 56 can be expressed as 4096/n, where $n = 0, \ldots, 4095$. The overall gain of the programmable phase-gain amplifier 42 can be expressed as $$\frac{N_1 N_3}{N_2 4096}$$

where, $N_1$ is the value of n programmed in programmable attenuator 54, $N_2$ is the value of n programmed in programmable amplifier 56, and $N_3$ is the value of n programmed into programmable attenuator 58.

Thus, it is to be appreciated that $N_2$ can be adjusted to obtain the desired amount of phase shift, and $N_1$ and $N_3$ can be adjusted to obtain the desired overall gain. When a programmable resistor block is used, such as device number AD7542 discussed above, the adjustment of the gain and phase of the programmable phase-gain amplifier of the present invention can be performed under computer control.

CALIBRATION METHOD

As discussed earlier, it is desirable to calibrate measurement systems in order to obtain accurate, repeatable results. The use of equipment in the calibration procedure that is externally traceable to a standard, such as the National Bureau of Standards (NBS), or another recognized standards organization, adds to the accuracy of the procedure and the final accuracy of the measurement system.

When a piece of equipment is said to be externally traceable, it is periodically sent to an outside service, such as an NBS certified lab, for calibration by that service. This periodic re-calibration insures that the service will keep a running log of the equipment health, and that a system, when calibrated by such NBS traceable equipment, will also be correct and be traceable through the log.

It can also be appreciated that it is desirable to keep to a minimum the number of pieces of equipment required in any calibration procedure, so that the overhead associated with externally traceable calibration be kept to a minimum.

In the calibration method of the present invention, only two pieces of externally traceable equipment are needed: (1) a digital voltmeter, and (2) an attenuator. Preferably, the equipment is traceable to the NBS. Preferably, the attenuator provides attenuation in steps of 3 db (3.010299 db absolute).

Figure 7:
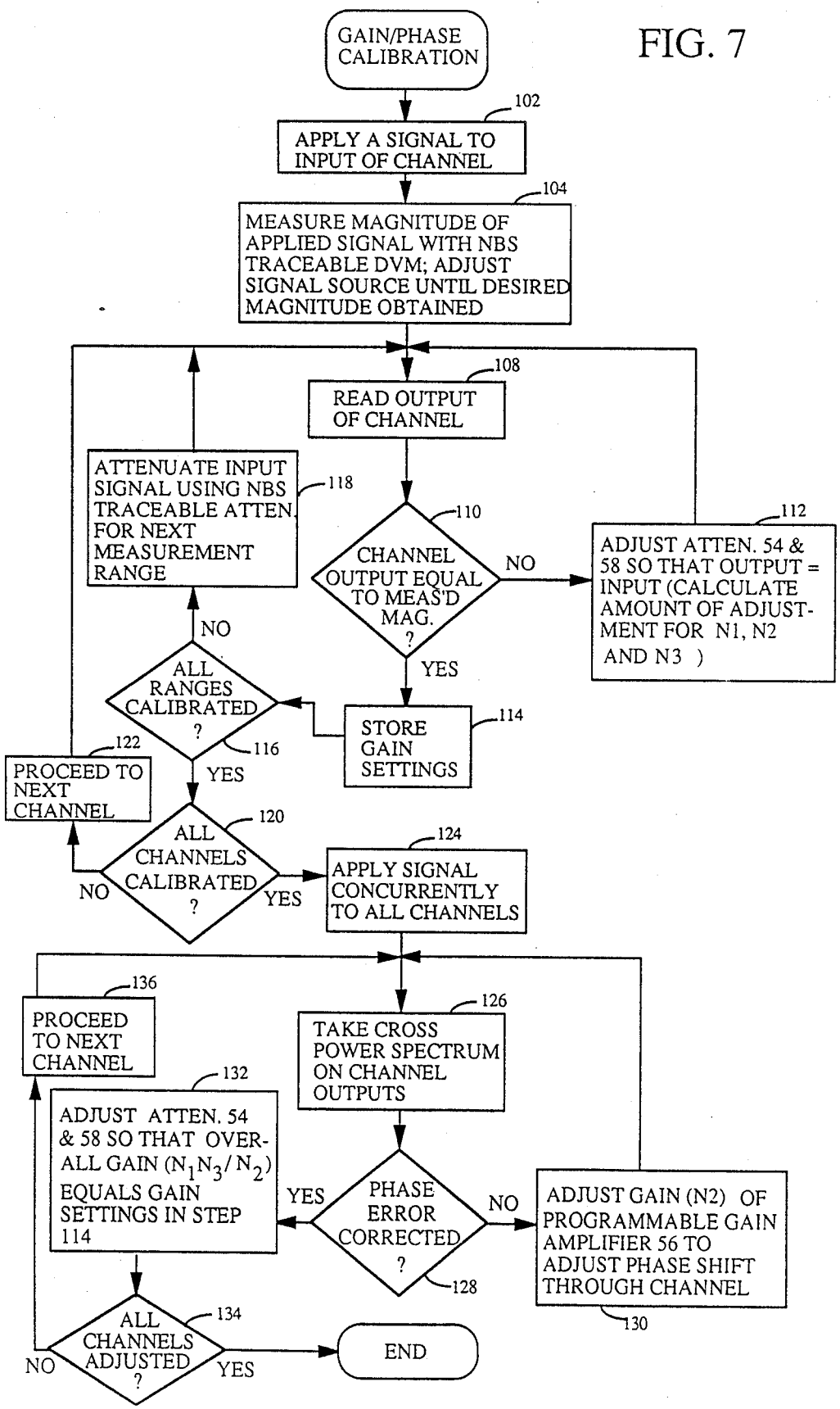
FIG. 7 is an illustrative flow diagram of the method of amplitude and phase calibration in accordance with the present, invention.

The calibration method of the present invention will now be described with reference to FIGS. 2A and 7 in the context of a vibration analysis system, it being understood that the method of the present invention is applicable to other measurement systems as well. As described earlier, the input channels of a vibration analysis system includes a number of cascaded elements, each of which can introduce gain or phase errors in the channel. The input channel is predominantly analog in format but provides its output in digital form. The input channel is intended to provide gains which range from 0 db upwards in steps of 3 db.

In accordance with the method of the present invention, the gain of each input channel is calibrated first, for each of the ranges of the input channel, beginning with a gain of 1 and the proceeding upwards in 3 db steps. The relative phase shifts through the input channels is then determined, and then the relative phase shift through each channel is then adjusted. This phase adjustment involves adjusting the gain of the programmable amplifier 56 in the programmable phase-gain amplifier 42 of each channel. Because this changes the overall gain through the programmable phase-gain amplifier 42 and hence through the channel, the programmable attenuators 54 and 58 are adjusted so that the overall gain through the programmable phase-gain amplifier 42 is the same as it was after the gain calibration portion of the method.

Figure 1B:
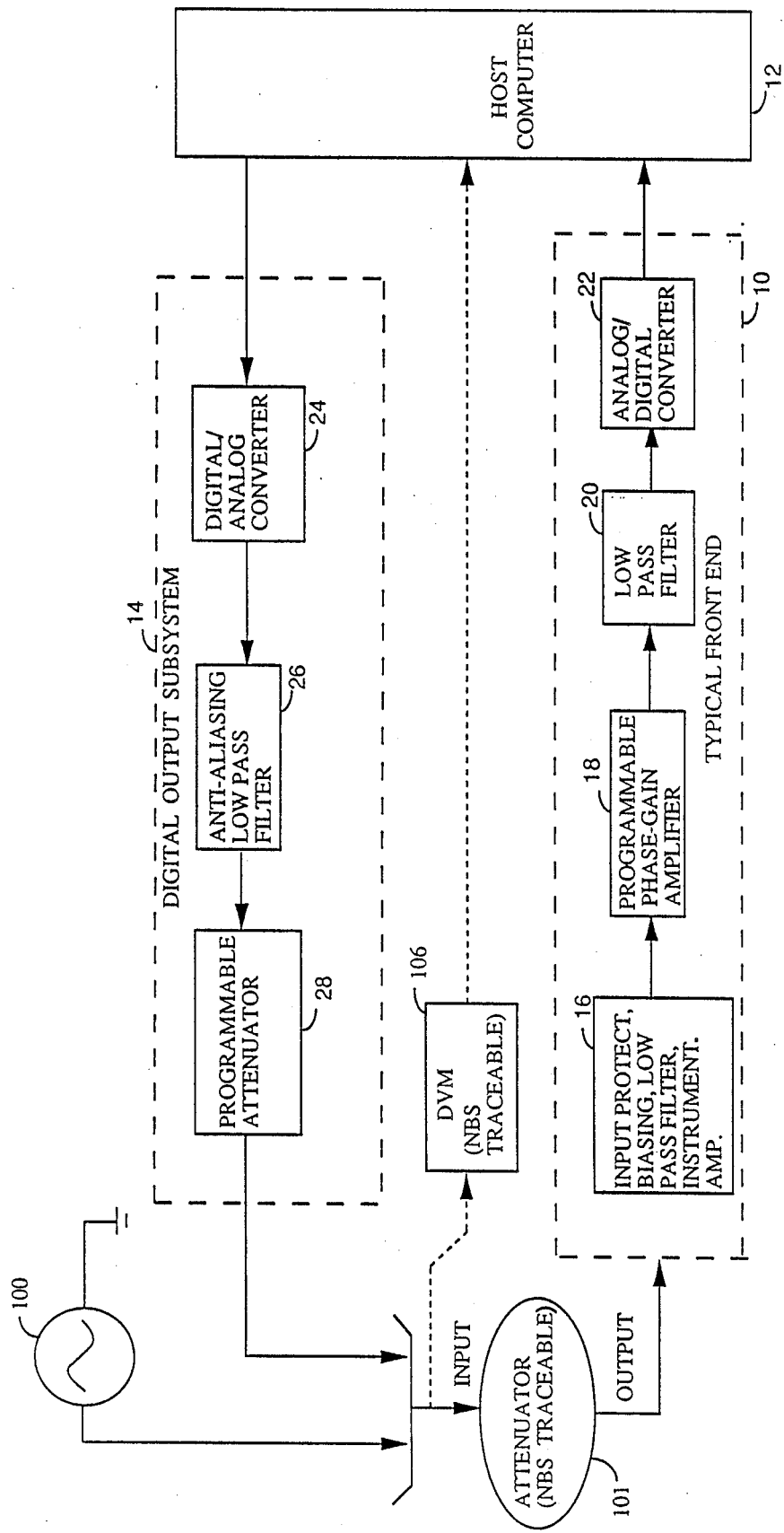
FIG. 1B is a simplified block diagram of the vibration analysis system of FIG. 1A illustrating the application of the method of the present invention to calibrate such a system.

To begin the calibration method, a signal from an internal or external signal source 100, FIGS. 1B and 2A, is applied to the input of the channel, step 102. In step 104, a digital voltmeter 104, which is traceable to the National Bureau of Standards, is used to measure the magnitude of the applied signal. The signal source 100 is then adjusted until a desired magnitude, such as 0 db, is obtained. FIG. 2A shows the connection of digital voltmeter 104 to measure the signal from signal source 100.

Next, in steps 108 and 110, the output of the channel, in digital form, is examined to determine if it has the same magnitude as the input to the channel. If the magnitudes are different, the attenuation through programmable attenuators 54 and 58 are adjusted so that the magnitudes are equal, see step 112. In this step, $N_1$ and $N_3$ are adjusted, and if needed $N_2$ can be adjusted. The amount of adjustment needed can be calculated by a number of techniques, one of which is illustrated in FIG. 8.

Figure 8:
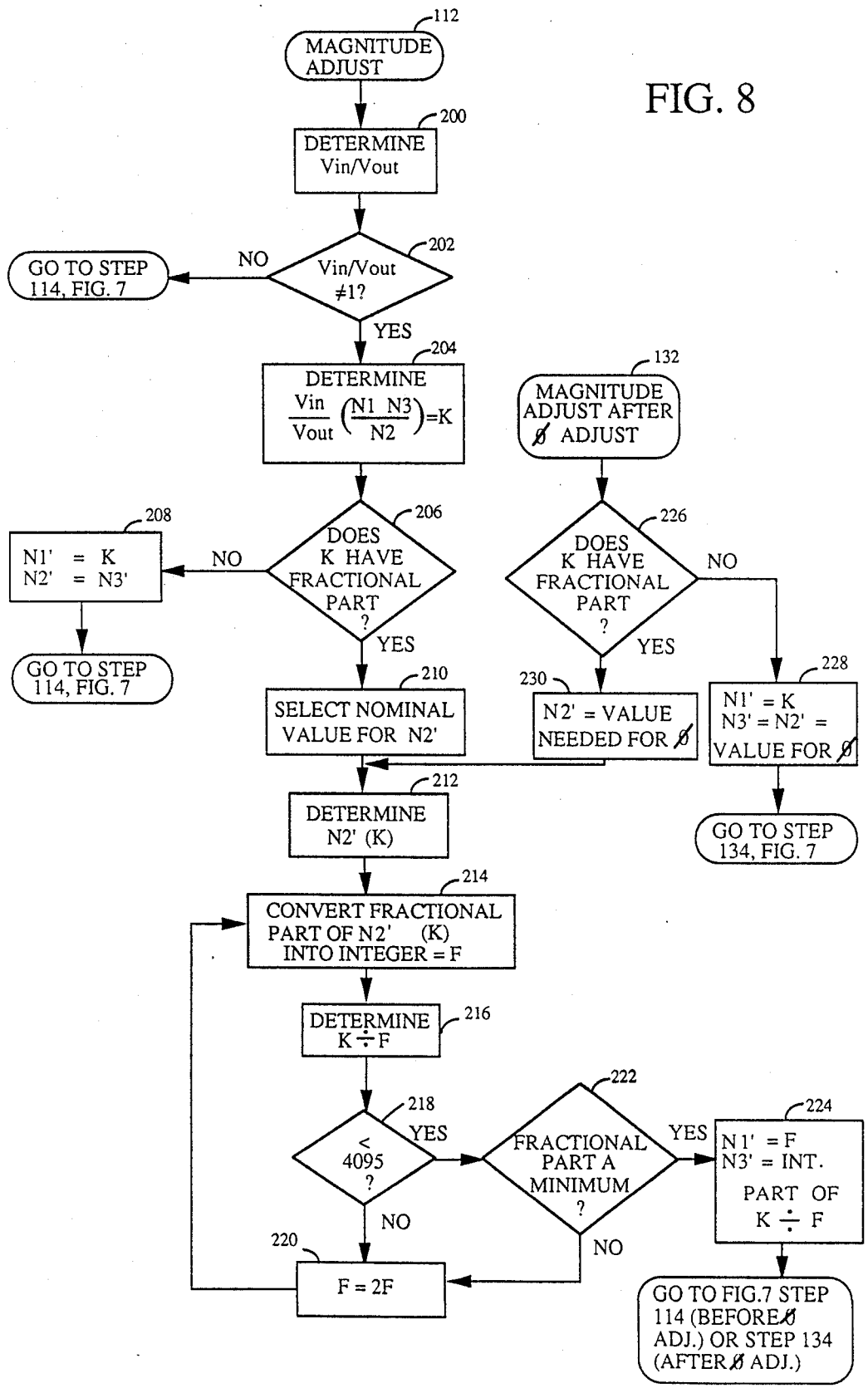
FIG. 8 is an exemplary, simplified flow diagram for determining the magnitude adjustment in accordance with the calibration method of the present invention.

In the magnitude adjust technique of FIG. 8, new values for $N_1$, $N_2$, and $N_3$ ($N_1'$, $N_2'$, and $N_3'$, respectively) are determined so that the proper overall gain for the channel is obtained. In this example, it is assumed that the gain desired equals a gain of one.

In step 200, the ratio of $V_{in}/V_{out}$ is determined. In step 202, if the ratio equals one, no adjustment is needed and the calibration proceeds to step 114, FIG. 7. If the ratio is not equal to one, step 204 is used to determine the overall gain setting for $N_1$, $N_2$, and $N_3$ which will result in a gain of one for the channel, namely $$N_1'N_3'/N_2' = (V_{in}/V_{out})(N_1N_3/N_2) = K.$$

If the resulting constant, K, has no fractional part, as determined in step 206, $N_1'$ is set equal to K, and $N_2'$ is set equal to $N_3'$, step 208.

If the answer in step 204 is yes, a nominal value for $N_2'$ is selected in step 210. In step 212, this nominal value is used to determine the product of $N_2'$ and K. The fractional part of this product is converted into an integer in step 214. For example, if the product of $N_2'$ and K is aaa.bbb, the converted fractional part would be F=bbb, where "aaa" is the non-fractional part.

In step 216, the constant K is divided by the converted fractional part F. If in step 218 the result is not less than 4095 (the maximum for the N's in this example), F is doubled in step 220, and steps 216 and 218 are repeated. Once the result of step 216 is less than 4095, step 222 is performed where it is determined whether the fractional part of the result is a minimum. When the fractional part of the result is a minimum, $N_1'$ is set equal to the current value of F, and $N_3'$ is set equal to the integer part of K/F, step 224.

If in step 222, the fractional part of the result is not at a minimum, step 220 is repeated to double the current value of F. At some point, the fractional part in step 216 will be at a minimum and the values of $N_1'$ and $N_3'$ can be set as in step 224. These gain settings are then stored, along with the value for K, in step 114, FIG. 7.

Returning to FIG. 7, after step 114 is processed, step 116 is performed to determine whether other ranges for the channel have yet to be calibrated. If yes, step 118 the NBS traceable attenuator 107 is used to attenuate the signal being applied to the input of the channel by a predetermined amount. This predetermined amount reduces the input signal magnitude so that the next measurement range of the channel can be calibrated. Preferably, there is a 3 db change in signal magnitude for each measurement range, and the signal that is applied corresponds to the full scale magnitude expected for that measurement range.

Following step 118, steps 108 through 116 are repeated for each of the measurement ranges for the channel.

In step 120 it is determined whether all channels have been calibrated. If not, step 122 is processed which routes the procedure back to step 108 for the next channel.

When small magnitude excitation signals are used, external noise compromises the accuracy of calibration efforts, including the calibration technique of the present invention. In the preferred embodiment of the present invention, direct current or periodic signals, which are amenable to direct averaging or Fourier Transform techniques, are used as the excitation source, coupled with direct averaging or Fourier Transform techniques in the host computer 12 as a part of the post processing of the data received from the channels that are being calibrated. This reduces the effects of external noise on the calibration technique of the present invention.

Once all channels have been calibrated, step 124 is performed to apply the same signal to all channels, concurrently, in preparation for adjusting the relative phase shifts of the channels. When calibrated, the relative phase shifts between the channels of the system will be zero.

To determine relative phase shift, the well known operation of a cross power spectrum is taken for the outputs of all of the channels. In step 128 the relative phase shift between channels is checked, and if an error exists, $N_2$ for the programmable amplifier 56 is adjusted in step 130 until the proper phase shift is obtained. This is determined by repeating steps 126 and 128.

Once the proper phase shift for the channel has been obtained, step 132 is processed to adjust $N_1$ and $N_3$ for attenuators 54 and 58 so that the overall constant K is maintained for the constant $K = N_1'N_3'/N_2'$, where $N_2'$ is that value which provides the desired phase shift, and $N_1'$ and $N_3'$ are those selected values.

Returning to FIG. 8, this readjustment of $N_1$ and $N_3$ is illustrated. In step 226, it is determined whether the constant K has a fractional part. If not, $N_1'$ is set equal to the constant, K, and $N_2'$ and $N_3'$ are both set equal to the value for $N_2'$ which provides the desired phase shift through the channel. The calibration procedure then returns to step 134 in FIG. 7.

If, in step 226, FIG. 8, the constant, K, has a fractional part, $N_2'$ is maintained at the value which provides the desired phase shift, step 230, then 212 through 224 are repeated. When these steps are completed, step 134, FIG. 7, is processed. In step 134 it is determined if all channels have been readjusted at all of their measurement ranges. If not, step 136 causes steps 126 through 134 to be repeated until all channels have been readjusted.

Because of the nature of the calibration method and the programmable phase-gain amplifier of the present invention, the calibration method is especially suited for implementation under computer control. The determination of $N_1$, $N_2$ and $N_3$, as well as the cross power spectrum are tasks that a computer can handle well. With such computer control, $N_1$, $N_2$ and $N_3$ values can be stored indefinitely for quick access, and quickly modified.

In the example provided of the method of the present invention, a signal source is used to excite the input channels of a vibration analysis system. Because the typical vibration analysis system includes a digital output subsystem, see FIG. 1B, in the preferred embodiment of the method of the present invention, the signal source is actually the digital output subsystem of the system. When a programmable phase-gain amplifier, as described hereinabove, is placed in the digital output subsystem of a system, the output of the digital output subsystem can be calibrated to an externally traceable standard in a manner similar to that just described in connection with the input channels.

Once the measurement system has been calibrated, a general system check can be performed each time the system is powered up. For example, upon power up, a signal can be generated by the digital output subsystem and applied to all input channels. If one input channel measures differently than the others, that input channel is probably the source of the problem. If all measure the same magnitude, but not the magnitude that the digital output subsystem is supposedly providing, then the output subsystem has the problem.

In another variation of the calibration method of the present invention, phase adjustment can be performed by varying the delay of the leading edge of the sample clock to the analog to digital converter 50, FIG. 2B.

For example, a sample clock is applied to a programmable delay device 49, such as an AD9500 Digital Delay Generator, manufactured by Analog Devices. The delay device produces a trigger pulse which is delayed in time from receipt of the leading edge of the sample clock. This trigger pulse is applied to the convert clock input of the analog to digital converter to cause the analog to digital converter to acquire a sample for conversion. The amount of delay programmed into the delay device is determined according to the equation $\delta t = \pi/2\pi f_s$, where $\phi$ is the relative phase difference between the channels at the frequency $f_s$, and $f_s$ is the frequency at which phase calibration is to be performed.

Phase calibration block 49 can be device number AD9500 as discussed above. Phase calibration block 49 receives the programmed delay from the host computer on bus 64. The trigger to the phase calibration block 49 is provided on line 51 from analog to digital converter control block 53. The trigger on line 51 similar to the convert clock supplied directly to analog to digital converter 50 in FIG. 2A. A write enable signal on line 55 causes the phase calibration block 49 to store the programmed delay on line 64.

When the phase adjustment technique of FIG. 2B is used, the gain through the channel is unaffected. In other words, gain adjustment is orthogonal with respect to phase adjustment. Therefore, in the flow diagram of FIG. 7, step 132 can be dispensed with when phase is adjusted by delaying the sample clock to the analog to digital converter relative to a reference sample clock. Also, block 130 will involve adjusting the time delay of the sample clock rather than adjusting the gain of amplifier 56.

As a further alternative, the phase shifter in the Pease article, referenced hereinabove, can be used in the calibration scheme of the present invention. However, the circuit suffers from limited bandwidth and more pronounced non-linearities in phase at frequencies above 5 kHz. For higher frequencies, the component values used, e.g. a few picofarads capacitance, may cause the circuit to be unstable and therefore not usable. In contrast, the sample clock delay technique of the present invention does not suffer from these limitations.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method that is traceable to the National Bureau of Standards, for calibrating an analysis system, the analysis system including a front end which receives and conditions signals from a device under test, a processing section which analyzes the signals from the front end including a determination of the magnitude of the signal from the front end, and an output subsystem which synthesizes signals for application to the device under test, wherein the front end includes an amplifier means that provides a programmable gain characteristic and a phase characteristic which is a function of the programmed gain, and attenuator means having a programmable attenuation characteristic, the method comprising the steps of
   a. applying a signal to the front end;
   b. measuring the magnitude of the signal being applied to the front end using equipment which is traceable to the National Bureau of Standards;
   c. causing the processing section to make a determination of the magnitude of the signal from the front end;
   d. programming the attenuator means so that the magnitude determined in step "c" substantially equals the magnitude measured in step "b"; and
   e. saving an indication of the amount of attenuation the attenuator means was programmed to have in step "d" for use in subsequent actual measurements by the analysis system.

2. The method of claim 1, wherein the analysis system measures signals that can fall in one of a plurality of signal magnitude ranges, and further wherein the method further includes the steps of
   f. using an external attenuator which is traceable to the National Bureau of Standards to attenuate the signal being applied to the input of the front end in step "a" by a sufficient amount so that the magnitude of the attenuated signal being applied to the front end falls in a different one of the plurality of signal magnitude ranges;

g. causing the processing section to make a determination of the magnitude of the signal from the front end;

h. programming the attenuator means so that the magnitude determined in step "g" substantially equals the magnitude of the attenuated signal being applied to the front end;

i. saving an indication of the amount of attenuation the attenuator means was programmed to have in step "h", wherein the indication is stored at a location associated with the particular signal magnitude range being calibrated, for use in subsequent actual measurements by the analysis system of signals in the particular signal magnitude range; and j. repeating steps "f" through "i" for different amounts of attenuation until the analysis system has been calibrated for each of its plurality of signal magnitude ranges.

3. The method of claim 2, wherein the magnitude of the signal applied to the front end is substantially equal to the maximum magnitude for the range being calibrated, and further wherein in step "f" the amount of attenuation provided by the attenuator is selected so that the attenuated signal being applied to the front end is substantially equal to the maximum magnitude of the signal magnitude range being calibrated.

4. The method of claim 3, wherein the analysis system has a plurality of signal channels, further including the steps of k. calibrating each of the plurality of different signal channels in accordance with steps "a" through "j";

l. applying the same signal to each of the calibrated plurality of signal channels;

m. measuring the relative phase shifts through each of the calibrated plurality of signal channels;

n. adjusting the gain of the amplifier means of each of the signal channels until the desired relative phase shifts between each of the calibrated plurality of signal channels is obtained;

o. storing the gain programmed into the amplifier means of each of the signal channels; and p. adjusting the amount of attenuation provided by the attenuator means so that the collective gain provided by the attenuator means and the amplifier means equals the indication of the amount of attenuation stored in step "i" for each of the signal channels.

5. The method of claim 4, wherein step "m" of measuring the relative phase shifts between each of the plurality of calibrated signal channels comprises the step of performing a cross power spectrum analysis on the plurality of calibrated signal channels.

6. The method of claim 3, wherein the analysis system has a plurality of signal channels each of which has an analog to digital converter at its output which is triggered by a sample clock which can be adjustably delayed relative to a reference sample clock of the analysis system, the method further including the steps of k. calibrating each of the plurality of different signal channels in accordance with steps "a" through "j";

l. applying the same signal to each of the calibrated plurality of signal channels;

m. measuring the relative phase shifts through each of the calibrated plurality of signal channels;

n. adjusting the delay of the sample clock, relative to the reference sample clock, supplied to the digital to analog converter at the output of each of the calibrated plurality of signal channels until the desired relative phase shifts between each of the calibrated plurality of signal channels is obtained; and o. storing the gain programmed into the amplifier means of each of the signal channels.

7. A method that is traceable to a recognized set of standards, for calibrating a plurality of signal channels which receive and condition signals and provide a binary indication of the magnitude of the signal at the output of the channel, wherein the each signal channel includes amplifier means that provide a programmable gain characteristic and a phase characteristic which is a function of the programmed gain, and attenuator means having a programmable attenuation characteristic, the method comprising the steps of a. applying a signal to a selected one of the plurality of signal channels;

b. measuring the magnitude of the signal being applied to the selected signal channel using equipment which is traceable to the recognized set of standards;

c. determining the magnitude of the signal at the output of the channel;

d. programming the attenuator means so that the magnitude determined in step "c" substantially equals the magnitude measured in step "b";

e. saving an indication of the amount of attenuation the attenuator means was programmed to have in step "d" for use in subsequent actual signal handling by the signal channel;

f. calibrating each of the plurality of different signal channels in accordance with steps "a" through "e";

g. applying the same signal to each of the calibrated plurality of signal channels;

h. measuring the relative phase shifts through each of the calibrated plurality of signal channels;

i. adjusting the gain of the amplifier means of each of the signal channels until the desired relative phase shifts between each of the calibrated plurality of signal channels is obtained;

j. storing the gain programmed into the amplifier means of each of the signal channels; and k. adjusting the amount of attenuation provided by the attenuator means so that the collective gain provided by the attenuator means and the amplifier means equals the indication of the amount of attenuation stored in step "i" for each of the signal channels.

8. The method of claim 7, wherein each of the plurality of signal channels handle signals that can fall in one of a plurality of signal magnitude ranges, and further wherein following step "f" and prior to step "g", the method further includes the steps of (i) using an external attenuator which is traceable to the recognized external set of standards to attenuate the signal being applied to the input of the selected signal channel in step "a" by a sufficient amount so that the magnitude of the attenuated signal being applied to the selected signal channels falls in a different one of the plurality of signal magnitude ranges;

(ii) determining the magnitude of the signal from the selected signal channel;

(iii) programming the attenuator means so that the magnitude determined in step "ii)" substantially equals the magnitude of the attenuated signal being applied to the front end;

(iv) saving an indication of the amount of attenuation the attenuator means was programmed to have in step "iii)", wherein the indication is stored at a location associated with the particular signal magnitude range being calibrated, for use in subsequent actual handling of signals by the selected signal channel in the particular signal magnitude range;

(v) repeating steps "i)" through "iv)" for different amounts of attenuation until the selected signal channel has been calibrated for each of its plurality of signal magnitude ranges; and (vi) repeating steps "i)" through "v)" for each of the plurality of signal channels.

9. A method that is traceable to a recognized set of standards, for calibrating a plurality of signal channels which receive and condition signals and provide a binary indication of the magnitude of the signal at the output of the channel at sample clock intervals, wherein the each signal channel includes a programmable sample clock delay and amplifier means that provide a programmable gain characteristic, the method comprising the steps of a. applying a signal to a selected one of the plurality of signal channels;

b. measuring the magnitude of the signal being applied to the selected signal channel using equipment which is traceable to the recognized set of standards;

c. determining the magnitude of the signal at the output of the channel;

d. programming the amplifier means so that the magnitude determined in step "c" substantially equals the magnitude measured in step "b";

e. saving an indication of the amount of gain the amplifier means was programmed to have in step "d" for use in subsequent actual signal handling by the signal channel;

f. calibrating each of the plurality of signal channels in accordance with steps "a" through "e";

g. applying the same signal to each of the calibrated plurality of signal channels;

h. measuring the relative phase shifts through each of the calibrated plurality of signal channels;

i. adjusting the programmable sample clock delay of each of the signal channels until the desired relative phase shifts between each of the calibrated plurality of signal channels is obtained; and j. storing the delay programmed for each of the signal channels for use in subsequent actual signal handling by each of the plurality of signal channels.

10. The method of claim 9, wherein each of the plurality of signal channels handle signals that can fall in one of a plurality of signal magnitude ranges, and further wherein following step "f" and prior to step "g", the method further includes the steps of (i) using an external attenuator which is traceable to the recognized external set of standards to attenuate the signal being applied to the input of the selected signal channel in step "a" by a sufficient amount so that the magnitude of the attenuated signal being applied to the selected signal channel falls in a different one of the plurality of signal magnitude ranges;

(ii) determining the magnitude of the signal from the selected signal channel;

(iii) programming the amplifier means so that the magnitude determined in step "ii)" substantially equals the magnitude of the attenuated signal being applied to the front end;

(iv) saving an indication of the amount of gain the amplifier means was programmed to have in step "iii)", wherein the indication is stored at a location associated with the particular signal magnitude range being calibrated, for use in subsequent actual handling of signals by the selected signal channel in the particular signal magnitude range;

(v) repeating steps "i)" through "iv)" for different amounts of attenuation until the selected signal channel has been calibrated for each of its plurality of signal magnitude ranges; and (vi) repeating steps "i)" through "v)" for each of the plurality of signal channels.

11. A signal channel for a measurement apparatus of the type which includes filtering and amplification circuitry which cause gain and phase variations to occur in a signal routed through the signal channel, the signal channel further including a programmable attenuator which provides a programmable amount of attenuation in the signal channel; and a programmable gain amplifier which provides a phase shift in the signal channel as a function of its programmed gain;

wherein the gain of the programmable gain amplifier is programmed to provide a phase which compensates for the phase variations in the signal channel and the programmable attenuator is programmed to compensate for the gain variation of the signal channel and the programmed gain of the programmable gain amplifier.

12. The signal channel of claim 11, wherein the signals to be handled by the signal channel have a predetermined frequency range, and further wherein the programmable attenuator includes a first variable gain amplifier having poles the location of which are modified so that gain changes have an insignificant effect on phase shift through the signal channel; and further wherein the programmable gain amplifier includes a second variable gain amplifier having poles the location of which are modified so that gain changes have a significant effect on phase shift through the signal channel.

13. The signal channel of claim 12, wherein the second variable gain amplifier includes an operational amplifier having an inverting input, a non-inverting input, and an output; and means connected between the output and the inverting input of the operational amplifier for providing a programmable value of resistance;

means connected to the non-inverting input of the operational amplifier for receiving the signal being routed through the signal channel and for providing a fixed value of resistance; and capacitance means connected in parallel with the programmable resistance means and having a value which is selected so that the location of the poles of the second variable gain amplifier are modified so that gain changes have a significant effect on phase shift through the second variable gain amplifier.

14. The signal channel of claim 13, wherein the location of the poles of the second variable gain amplifier are modified so that gain changes of one db cause a change in phase of typically 1.0 degrees.

15. The signal channel of claim 14, wherein the first variable gain amplifier includes an operational amplifier having an inverting input, a non-inverting input, and an output; and means connected between the output and the inverting input of the operational amplifier for providing a fixed value of resistance;

means connected to the non-inverting input of the operational amplifier for receiving the signal being routed through the signal channel and providing a programmable value of resistance; and capacitance means connected in parallel with the fixed resistance means and having a value which is selected so that the location of the poles of the first variable gain amplifier are modified so that gain changes have an insignificant effect on phase shift through the first variable gain amplifier.

16. The signal channel of claim 15, wherein the location of the poles of the first variable gain amplifier are modified so that gain changes of one db cause a change in phase of typically 0.01 degrees.

17. A plurality of signal channels for use in a measurement apparatus each of which includes filtering and amplification circuitry which cause gain and phase variations to occur in a signal routed through the signal channel, and which includes converter means for providing at sample clock intervals a binary representation of the magnitude of the signal routed through the signal channel, each signal channel further including programmable delay means which provide a programmable amount of delay in the sample clock provided to the converter means so that relative phase differences between each of the plurality of signal channels can be corrected within the signal path; and a programmable gain amplifier which provides magnitude correction in the signal channel of the signal being routed through the channel;

wherein the gain of the programmable gain amplifier is orthogonal with respect to the phase variations in the signal channel.

18. A amplifier stage for providing a desired gain and phase shift, comprising amplifier means for providing a programmable gain characteristic and a phase characteristic which is a function of the programmed gain, wherein the gain characteristic of the amplifier means is programmed to provide the desired phase shift for the amplifier stage; and attenuator means for providing a programmable attenuation characteristic, wherein the attenuator means is programmed to provide an attenuation characteristic which when combined with the programmed gain characteristic of the amplifier means provides the desired gain for the amplifier stage.

19. The amplifier of claim 18, wherein the signals to be handled by the amplifier have a predetermined frequency range, and further wherein the programmable attenuator includes a first variable gain amplifier having poles the location of which are modified so that gain changes have an insignificant effect on phase shift through the amplifier; and further wherein the programmable gain amplifier includes a second variable gain amplifier having poles the location of which are modified so that gain changes have a significant effect on phase shift through the amplifier.

20. The signal channel of claim 19, wherein the second variable gain amplifier includes an operational amplifier having an inverting input, a non-inverting input, and an output; and means connected between the output and the inverting input of the operational amplifier for providing a programmable value of resistance;

means connected to the non-inverting input of the operational amplifier for receiving the signal being routed through the signal channel and for providing a fixed value of resistance; and capacitance means connected in parallel with the programmable resistance means and having a value which is selected so that the location of the poles of the second variable gain amplifier are modified so that gain changes have a significant effect on phase shift through the second variable gain amplifier.

21. The signal channel of claim 20, wherein the location of the poles of the second variable gain amplifier are modified so that gain changes of one db cause a change in phase of typically 1.0 degrees.

22. The signal channel of claim 21, wherein the first variable gain amplifier includes an operational amplifier having an inverting input, a non-inverting input, and an output; and means connected between the output and the inverting input of the operational amplifier for providing a fixed value of resistance;

means connected to the non-inverting input of the operational amplifier for receiving the signal being routed through the signal channel and providing a programmable value of resistance; and capacitance means connected in parallel with the fixed resistance means and having a value which is selected so that the location of the poles of the first variable gain amplifier are modified so that gain changes have an insignificant effect on phase shift through the first variable gain amplifier.

23. The signal channel of claim 22, wherein the location of the poles of the first variable gain amplifier are modified so that gain changes of one db cause a change in phase of typically 0.01 degrees.

24. A method for providing an amplifier stage having a desired gain and phase shift, the amplifier stage having an amplifier means that provides a programmable gain characteristic and a phase characteristic which is a function of the programmed gain, and attenuator means having a programmable attenuation characteristic, comprising the steps of programming the gain characteristic of the amplifier means to provide the desired phase shift for the amplifier stage; and programming the attenuator means to provide an attenuation characteristic which when combined with the programmed gain characteristic of the amplifier means provides the desired gain for the amplifier stage.

* * * * *